United States Patent
Pendharkar et al.

(10) Patent No.: US 11,721,738 B2
(45) Date of Patent: *Aug. 8, 2023

(54) LATERALLY DIFFUSED METAL OXIDE SEMICONDUCTOR WITH GATE POLY CONTACT WITHIN SOURCE WINDOW

(71) Applicant: TEXAS INSTRUMENTS INCORPORATED, Dallas, TX (US)

(72) Inventors: Sameer Pendharkar, Allen, TX (US); Guru Mathur, Plano, TX (US)

(73) Assignee: Texas Instmments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/197,188

(22) Filed: Mar. 10, 2021

(65) Prior Publication Data

US 2021/0193809 A1 Jun. 24, 2021

Related U.S. Application Data

(60) Continuation of application No. 16/127,281, filed on Sep. 11, 2018, now Pat. No. 10,957,774, which is a (Continued)

(51) Int. Cl.
*H01L 29/423* (2006.01)
*H01L 29/06* (2006.01)
(Continued)

(52) U.S. Cl.
CPC ...... *H01L 29/4238* (2013.01); *H01L 29/0653* (2013.01); *H01L 29/0696* (2013.01);
(Continued)

(58) Field of Classification Search
CPC ........... H01L 29/7835; H01L 29/41756; H01L 29/0847; H01L 29/0856; H01L 29/0696;
(Continued)

(56) References Cited

U.S. PATENT DOCUMENTS 5,057,886 A * 10/1991 Riemenschneider ........................
H01L 29/7885
257/317
5,111,253 A 5/1992 Korman et al.
(Continued)

OTHER PUBLICATIONS

John Pritiskutch and Brett Hanson, "Understanding LDMOS Device Fundamentals", AN1226, Application Note, STMicroelectronics, Jul. 2000, pp. 1-4.

*Primary Examiner* — Michael M Trinh
(74) *Attorney, Agent, or Firm* — Andrew R. Ralston; Frank D Cimino

(57) ABSTRACT

An integrated circuit includes a power transistor having at least one transistor finger that lies within a semiconductor material substrate. Each transistor finger has a source region stripe and a substantially parallel drain region stripe. A gate structure lies between the source region stripe and the drain region stripe and has a plurality of fingers that extend over the source region stripe. Contacts are formed that connect to the fingers of the gate structure over thick oxide islands in the source region stripes. A conductive gate runner is connected to the contacts of the gate layer structure over the thick oxide islands in the source region stripe.

20 Claims, 7 Drawing Sheets

Related U.S. Application Data division of application No. 15/394,636, filed on Dec. 29, 2016, now Pat. No. 10,103,258.

(51) Int. Cl.

| | | |
|---|---|---|
| *H01L 29/66* | (2006.01) | |
| *H01L 29/78* | (2006.01) | |
| *H01L 29/08* | (2006.01) | |
| H01L 23/528 | (2006.01) | |
| H01L 29/417 | (2006.01) | |
| H01L 29/10 | (2006.01) | |

(52) U.S. Cl.
CPC .... *H01L 29/0847* (2013.01); *H01L 29/66659* (2013.01); *H01L 29/7835* (2013.01); *H01L 23/528* (2013.01); *H01L 29/1045* (2013.01); *H01L 29/41758* (2013.01); *H01L 29/42368* (2013.01)

(58) Field of Classification Search
CPC .......... H01L 29/0653; H01L 29/42368; H01L 29/1045; H01L 29/4238; H01L 29/66659; H01L 29/7816

See application file for complete search history.

(56) References Cited

U.S. PATENT DOCUMENTS

| | | | |
|---|---|---|---|
| 5,459,355 A | 10/1995 | Kreifels | |
| 5,763,907 A | 6/1998 | Dallavalle et al. | |
| 5,767,546 A | 6/1998 | Williams et al. | |
| 5,912,495 A | 6/1999 | Depetro et al. | |
| 6,081,449 A | 6/2000 | Sekariapuram et al. | |
| 6,107,160 A | 8/2000 | Hebert et al. | |
| 6,653,691 B2 | 11/2003 | Baliga | |
| 6,858,901 B2 | 2/2005 | Ker et al. | |
| 7,023,032 B1 | 4/2006 | Doyle et al. | |
| 7,098,510 B2 | 8/2006 | Kodama et al. | |
| 7,186,592 B2 * | 3/2007 | Schillaci | H01L 29/41758 257/E29.12 |
| 7,875,930 B2 | 1/2011 | Tsai | |
| 8,035,140 B2 | 10/2011 | Birner et al. | |
| 8,110,852 B2 | 2/2012 | Iwamatsu | |
| 8,513,707 B2 | 8/2013 | Herberholz | |
| 8,513,736 B2 | 8/2013 | Fujii | |
| 8,592,900 B2 | 11/2013 | Steinmann et al. | |
| 8,664,725 B1 | 3/2014 | Venkitachalam et al. | |
| 8,680,584 B2 | 3/2014 | Brand | |
| 9,030,877 B2 | 5/2015 | Strenz et al. | |
| 9,190,479 B1 | 11/2015 | Greenberg et al. | |
| 9,324,858 B2 | 4/2016 | Bhalla et al. | |
| 9,559,170 B2 | 1/2017 | Stribley | |
| 9,865,729 B1 | 1/2018 | Pendharkar et al. | |
| 9,905,558 B1 | 2/2018 | Appaswamy et al. | |
| 10,103,258 B2 * | 10/2018 | Pendharkar | H01L 29/0847 |
| 2004/0094806 A1 | 5/2004 | Schillaci et al. | |
| 2004/0245546 A1 | 12/2004 | Lin et al. | |
| 2005/0029540 A1 | 2/2005 | Kodama et al. | |
| 2005/0184338 A1 | 8/2005 | Huang et al. | |
| 2005/0225350 A1 | 10/2005 | Toshiyuki et al. | |
| 2009/0026539 A1 * | 1/2009 | Birner | H01L 29/0653 257/389 |
| 2012/0049187 A1 | 3/2012 | Haruyama et al. | |
| 2013/0200939 A1 | 8/2013 | Deboy | |
| 2013/0313653 A1 * | 11/2013 | Brech | H01L 29/7835 257/E27.081 |
| 2013/0341715 A1 | 12/2013 | McGregor | |
| 2014/0151796 A1 * | 6/2014 | Huang | H01L 29/7835 257/337 |
| 2015/0179527 A1 | 6/2015 | Chan et al. | |
| 2015/0249126 A1 | 9/2015 | Kataoka et al. | |
| 2015/0255596 A1 | 9/2015 | Cai | |
| 2016/0104796 A1 | 4/2016 | Yao et al. | |
| 2016/0126349 A1 * | 5/2016 | Edwards | H01L 23/4824 257/341 |
| 2016/0336427 A1 | 11/2016 | Zhang et al. | |
| 2017/0077294 A1 | 3/2017 | Edwards | |
| 2017/0271329 A1 * | 9/2017 | Farrell | H01L 29/404 |

* cited by examiner

VIEW A-A

LATERALLY DIFFUSED METAL OXIDE SEMICONDUCTOR WITH GATE POLY CONTACT WITHIN SOURCE WINDOW

CROSS REFERENCE TO RELATED APPLICATIONS

This application is a continuation of U.S. patent application Ser. No. 16/127,281, issued as U.S. Pat. No. 10,957,774, which is a divisional of U.S. patent application Ser. No. 15/394,363, filed Dec. 29, 2016 and issued as U.S. Pat. No. 10,103,258. The entireties of both applications are hereby incorporated herein by reference.

FIELD OF THE DISCLOSURE

This disclosure relates to power transistors, and in particular to laterally diffused metal oxide semiconductor devices.

BACKGROUND OF THE DISCLOSURE

Power transistors are found in many common electronic devices, including power supplies, voltage converters, integrated circuits, and low-voltage motor controllers. Laterally diffused metal oxide semiconductor (LDMOS) transistors are one type of power transistor and are also used in microwave and radio frequency (RF) power amplifiers, for example. These transistors are often fabricated on p/p+ silicon epitaxial layers.

LDMOS transistors are metal oxide semiconductor (MOS) transistors that also have a drain drift region. The drain drift region, which touches and lies between the drain and the channel region, has the same conductivity type as the drain, but a lower dopant concentration than the drain. A depletion region forms in this lightly doped lateral diffused region resulting in a voltage drop between the drain contact and the transistor gate. With proper design, sufficient voltage may be dropped between the drain contact and the gate dielectric to allow a low gate voltage transistor to be used as a switch for the high voltage.

A large power transistor may be made up of many "fingers," each of which can be long and may be considered to include multiple sub-transistors.

BRIEF DESCRIPTION OF THE DRAWINGS

Particular embodiments in accordance with the disclosure will now be described, by way of example only, and with reference to the accompanying drawings.

Figure 1:
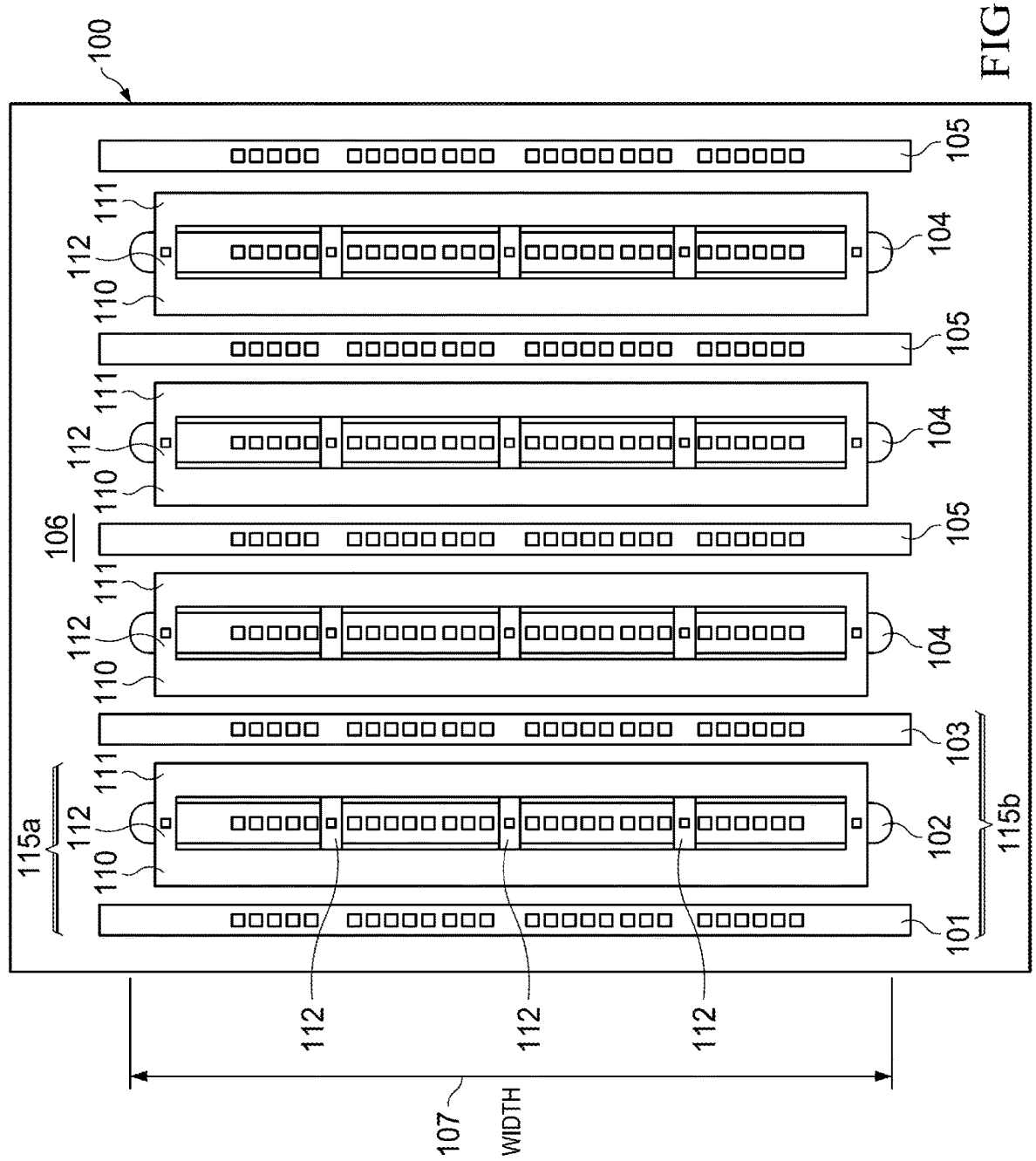
FIG. 1 is a top view of an example multi-finger LDMOS transistor.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure.

There are design tradeoffs in the power conversion space. Higher switching frequency power converters are preferred because high frequency operation allows the use of smaller size filters and passive circuit elements. This is driving a reduction in gate charge (Qg) and a figure of merit referred to as "RxQg" which is channel resistance (Rdson) times gate charge Qg. Gate charge is proportional to gate capacitance and refers to the amount of charge required to produce a control voltage on the gate of the power device. Higher switching frequency is also driving the use of shorter gate length devices in order to reduce RxQg, which is proportional to gate length. On the other hand, there is a desire to design higher current power devices to improve power density. Improvements in semiconductor processing are providing advanced lithography nodes which are driving towards thinner poly for the gate with a resultant increase in resistivity of the gate poly.

These various tradeoffs may be managed by using large power FETs that have a large effective channel width. A multi-finger layout may be used in order to provide low gate resistance (Rgate) in order to reduce gate signal transmission time for uniform turn-on/off. However, a reduction in the thickness of the gate electrode may result in increased gate resistivity. Increased resistivity may be a concern for power devices with long fingers because fast switching may cause non-uniform gate turn-on/off. Non-uniform gate turn-on/off may cause a concentrated current flow in a portion of the power transistor which may be a potential functionality/reliability concern.

A metal distribution bus may be used to distribute a gate signal voltage to the various fingers of a large power device. However, metal contacts to the poly cannot be done over the gate oxide because it is so thin that the metal contact may puncture the gate oxide layer. To prevent non-uniform gate turn-on/off, the poly gate finger may be broken into segments at regular intervals in order to provide a location for contacts. Then, a high conductivity metallic interconnect element may be connected to the contact locations in the poly gate segment to improve distribution of the gate control voltage. However, the effective channel width of the device may be reduced and this may lead to an overall increase in effective Rdson for the device, which is undesirable. Breaking up the gate results in area overhead, increased die area, and increased effective specific on resistance (Rsp).

Another solution is to provide extensions from the gate poly over the source region and to have a poly contacts placed within the source window over thicker dielectric. This avoids contacting poly on thin gate dielectric which has reliability implications. Metal routing may then be contacted within the gate extensions to distribute the gate signal and does not require breaking up of the device. This approach may improve gate resistance without a penalty of an increase in overall device Rdson. An embodiment of this approach will now be disclosed in more detail.

FIG. 1 is a top view of an example multi-finger LDMOS transistor 100, sometimes referred to for brevity as LDMOS transistor 100 or transistor 100. In this example, metal interconnect layers have been removed in order to more clearly see an aspect of the underlying structure. A first finger 115a of transistor 100 includes a source region stripe 102 and a substantially parallel drain region stripe 101 that lie within a semiconductor substrate 106. In this example, a second substantially parallel drain region stripe 103 shares source region stripe 102. This configuration is shown as finger 115b. In some embodiments, there may be only one finger that may include only one source region stripe 102 and one drain region stripe 101, for example. In other embodiments, there may be only one finger that may include only one source region stripe 102 and two drain region stripes 101, 103, for example. In yet other embodiments, there may be multiple fingers in which additional substantially parallel source region stripes 104 and drain region stripes 105 are included. In the case of multiple source and drain region stripes, conductive interconnects may be used to connect the drain region stripes 101, 103, 105, etc., in parallel and to connect the source region stripes 102, 104, etc., in parallel to form a single transistor with multiple parallel fingers. The conductive interconnects may be metallic, for example. In other embodiments, the conductive interconnects may be polysilicon, silicide, or other known or later developed conductive interconnect materials. Semiconductor substrate 106 is typically silicon; however other embodiments of the disclosure may be applied to other semiconductor materials, such as germanium, etc.

A channel region stripe is located substantially parallel to and between each of the source region stripes and the drain region stripes. A polysilicon gate structure 110 overlies a gate oxide region stripe that overlies the channel region stripe between source region stripe 102 and drain region stripe 101. In this example, a similar polysilicon gate structure 111 overlies a gate oxide region stripe that overlies the channel region stripe between source region stripe 102 and drain region stripe 103. Similar polysilicon gate structures may be located between each source and drain region of the multiple fingers. Each polysilicon gate structure may also have one or more extensions 112 that extend over source region stripes 102, 104 that may be used for metal contacts, as will be described in more detail below.

Each channel region has a width 107, and the total effective channel width of transistor 100 is the sum of the widths of all of the channel regions of all of the fingers.

The general operation of LDMOS devices is well known; see, for example, "Understanding LDMOS Device Fundamentals," John Pritiskutch, et al. The acronym "LDMOS" is a concatenation of acronyms that have been used to designate various aspects of the lateral device and often stands for lateral current (L) double-diffused MOS (DMOS). These devices can be created in two common types, the PMOS (p-type MOSFET) and NMOS (n-type MOSFET).

An LDMOS transistor is a three terminal device (assuming the substrate is shorted to source), commonly identified as the source, gate and drain, where the voltage on the gate controls the current flowing from the drain to the source. The most common circuit configuration for these devices is the common source (CS) configuration, which is comparable (in some respects) to the common emitter configuration of the bipolar transistor. Other configurations may be used, but under the CS configuration the drain is connected to the high DC voltage while the source is grounded. The gate is used to induce a field-enhanced depletion region between the source and drain, and thereby create a "channel." The acronym NMOS was derived from the fact that the p-type channel has been inverted, creating an effective n-type material due to the depletion of the holes in the p-type channel. A high concentration of electrons is left with energy near the conduction band due to the barrier lowering caused by the gate field, and the electrons can then accelerate due to the field produced by the drain to source biasing. The LDMOS channel is predominately defined by the physical size of the gate structure (ignoring secondary effects due to diffusion vagaries) that overlies the graded p-type threshold adjust implantation and diffusion area. The source and drain regions are on the laterally opposing sides of the gate area, and the diffusion process may produce an undercut region below the gate due to the single-step lateral diffusion process that defines the source and drain regions. The source and drain regions under bias create depletion regions that are connected by the gate induced depletion region in the p-body, and this connection defines the "effective channel length" which is a measure of the distance between the source and drain depletion edges. For NMOS, the depletion region is a region where the high electric field lowers the energy barrier to the electron conduction band. Once the barrier is lowered sufficiently, current easily flows between source and drain. LDMOS channel current is controlled by the vertical electric field induced by the gate and the lateral field that is asserted between the source and drain.

One criterion for selecting the gate material is that it is a good conductor. Highly doped polycrystalline silicon is an acceptable candidate but may or may not be an ideal conductor. Nevertheless, there are several reasons favoring the use of polysilicon as a gate material. The threshold voltage, and consequently the drain to source on-current, is modified by the work function difference between the gate material and channel material. Because polysilicon is a semiconductor, its work function may be modulated by adjusting the type and level of doping. Furthermore, because polysilicon has the same bandgap as the underlying silicon channel, it is quite straightforward to tune the work function to achieve low threshold voltages for both NMOS and PMOS devices. By contrast, the work functions of metals are not easily modulated, so tuning the work function to obtain low threshold voltages becomes a significant challenge.

The silicon-SiO2 interface has been well studied and is known to have relatively few defects. By contrast many metal-insulator interfaces contain significant levels of defects which can lead to Fermi level pinning, charging, or other phenomena that ultimately degrade device performance.

In the MOSFET IC fabrication process, it is preferable to deposit the gate material prior to certain high-temperature steps in order to make better-performing transistors. Such high temperature steps would melt some metals, limiting the types of metal that can be used in a metal-gate-based process.

However, since polysilicon is not a low resistance conductor, the signal propagation speed through the material is reduced as compared to metal. The resistivity can be lowered by increasing the level of doping, but even highly doped polysilicon is not as conductive as most metals.

Figure 2:
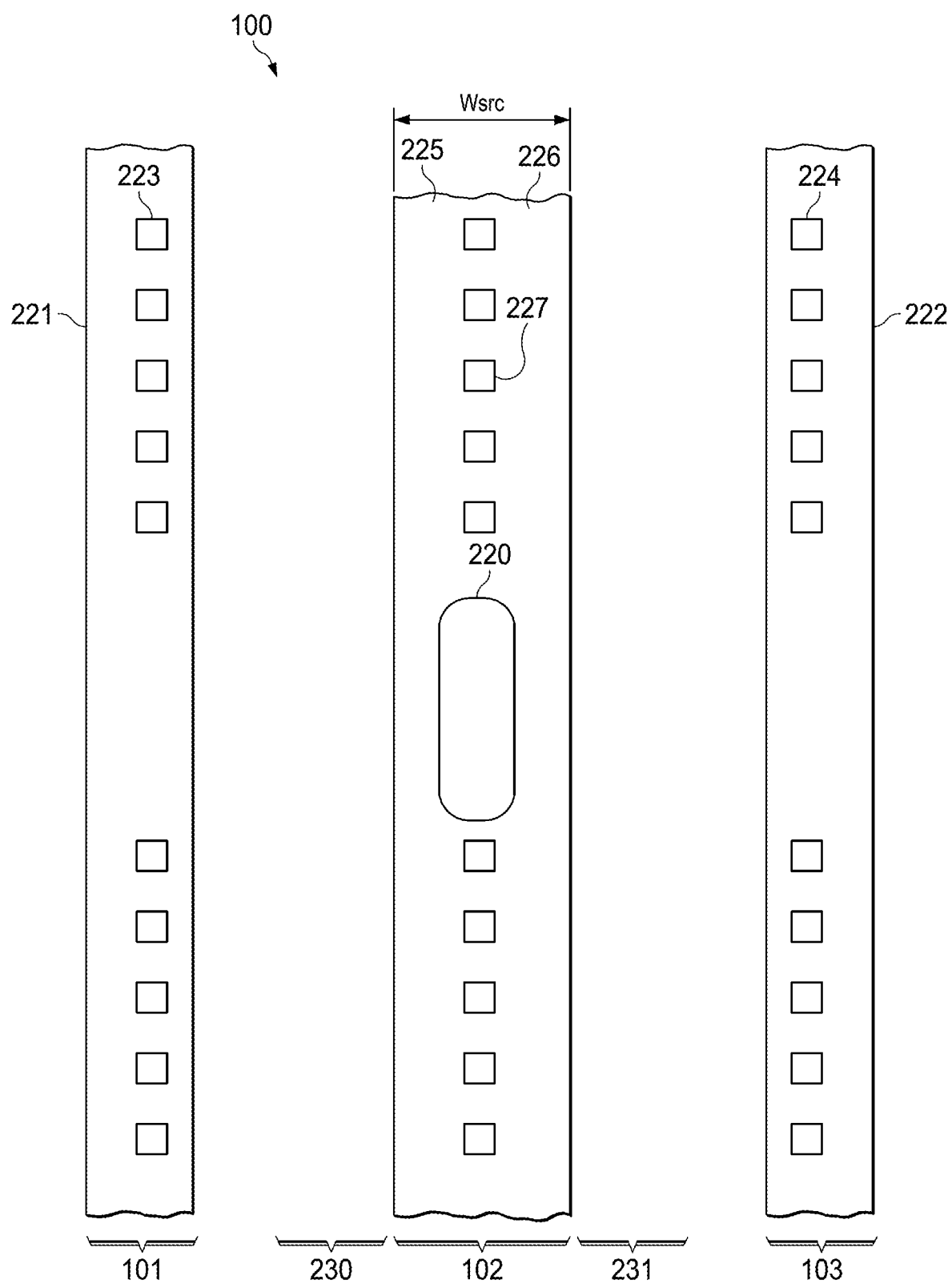
FIGS. 2 and 3 are more detailed views of a portion of the LDMOS transistor of FIG. 1.
Figure 3:
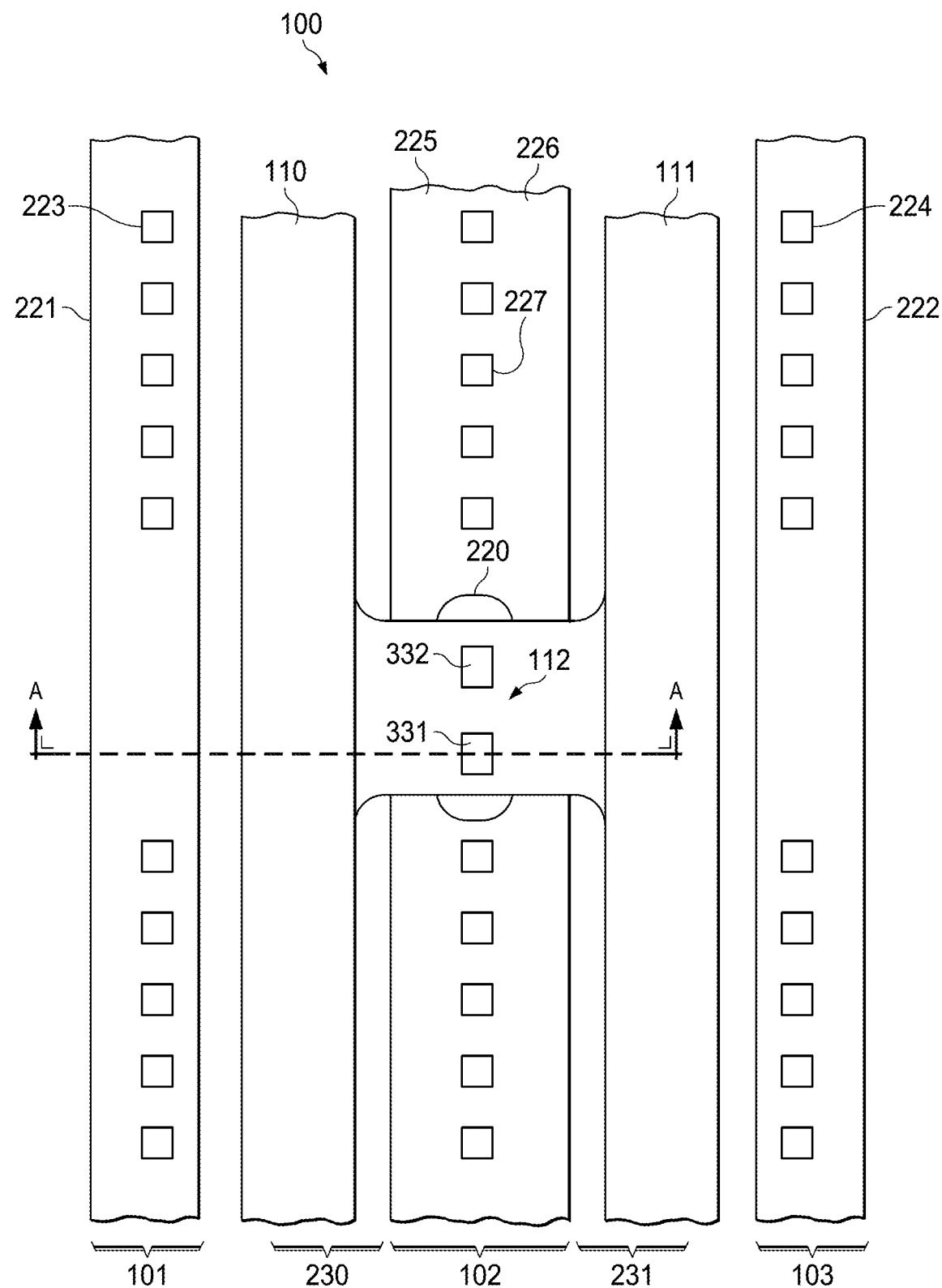
Figure 5:
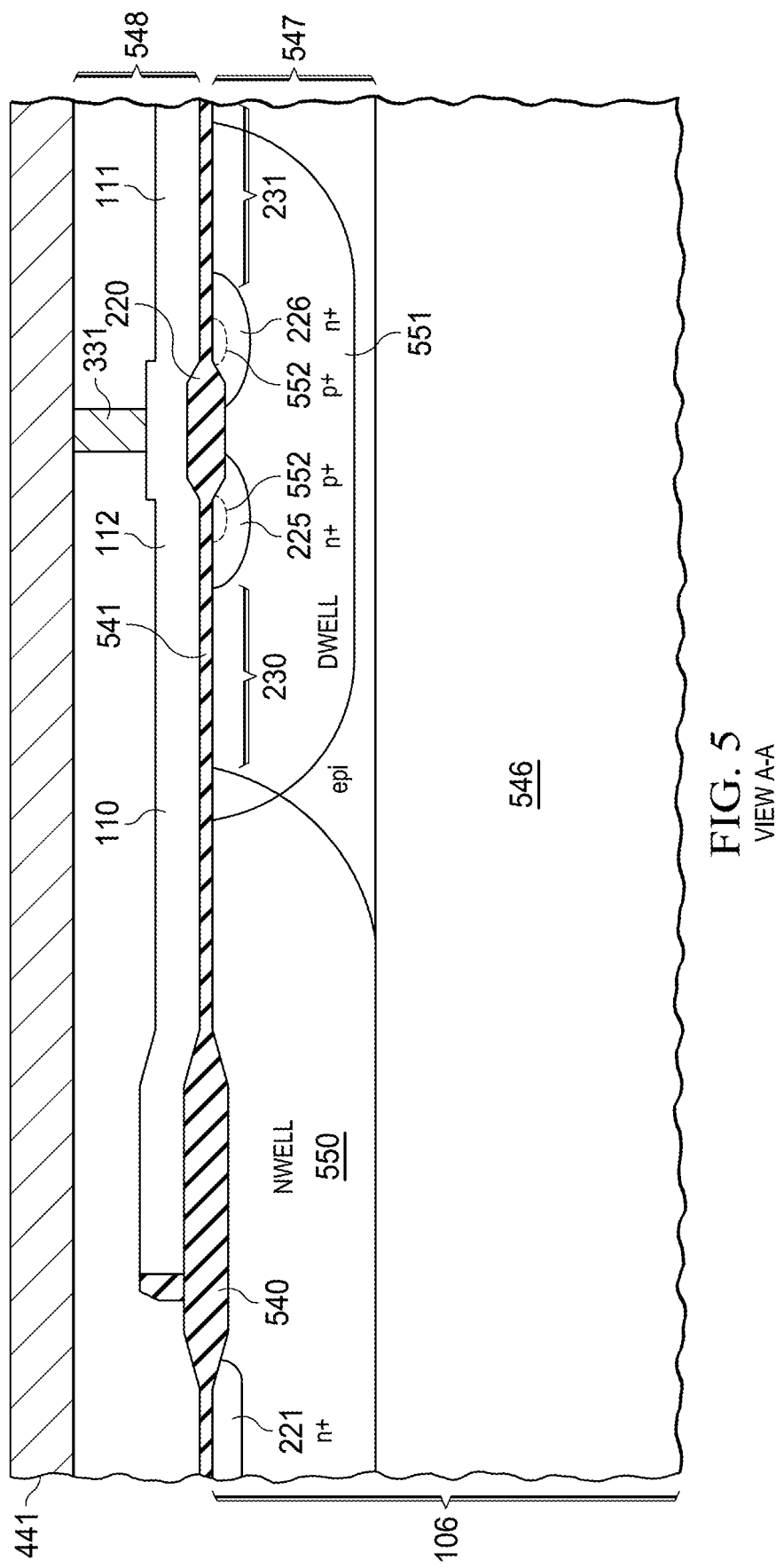
FIG. 5 is a cross sectional view of a portion of the LDMOS transistor of FIG. 1.

FIGS. 2 and 3 are more detailed views of a portion of the LDMOS transistor 100 of FIG. 1. In FIG. 2, drain region stripe 101 includes an n+ region 221 and contacts 223 that provide for interconnection to metal interconnect layers. Similarly, drain region stripe 103 includes an n+ region 222 and contacts 224. Source region stripe 102 includes n+ region 225 oriented towards drain region stripe 101 and n+ region 226 oriented towards drain region stripe 103. There is also a p+ region 552 for contacts 227, which is shown in FIG. 5.

A channel region stripe 230 is located substantially parallel to and between the source region stripe 102 and the drain region stripe 101 in n+ region 222. Similarly, a channel region stripe 231 is located substantially parallel to and between the source region stripe 102 and the drain region stripe 103.

A thick field oxide island 220 may be formed within source region stripe 102. This does not need additional area because the source window size is normally more than a minimum poly-poly space determined by a deep DWELL implant requirement to get n+ regions 225, 226 and a p+ region 552 (see FIG. 5) in the window and to keep p+ region 552 away from the gate edge. In this example, the width of the source region (Wsrc) is approximately 0.8 um. The design rules of the process allow fitting a poly contact within 0.8 um. The oxide island 220 is thick enough to provide a reliable insulation for poly contacts formed above it. The oxide island 220 is representative of a set of islands that are formed at intervals along the length of each source region stripe.

In another embodiment, oxide islands 220 may be formed using a shallow trench isolation (STI) process. In this case, a portion of silicon is etched and then filled with oxide. Thick oxide formed using STI may be planarized with the top of the thick filled oxide being at approximately the same level as the adjacent silicon top surface.

FIG. 3 illustrates polysilicon gate structure 110 which overlies the channel region between source region stripe 102 and drain region stripe 101, and polysilicon gate structure 111 which overlies the channel region between source region stripe 102 and drain region stripe 103. Polysilicon extension 112 extends from gate structure 110 and gate structure 111 to overlie the oxide island 220 that is formed in source region stripe 102. Contacts 331, 332 may then be formed to contact a metal interconnect layer that is formed above the gate structures. While two contacts are illustrated here over the oxide island 220, in other embodiments there may be only a single contact, or there may be more than two contacts, for example.

Figure 4:
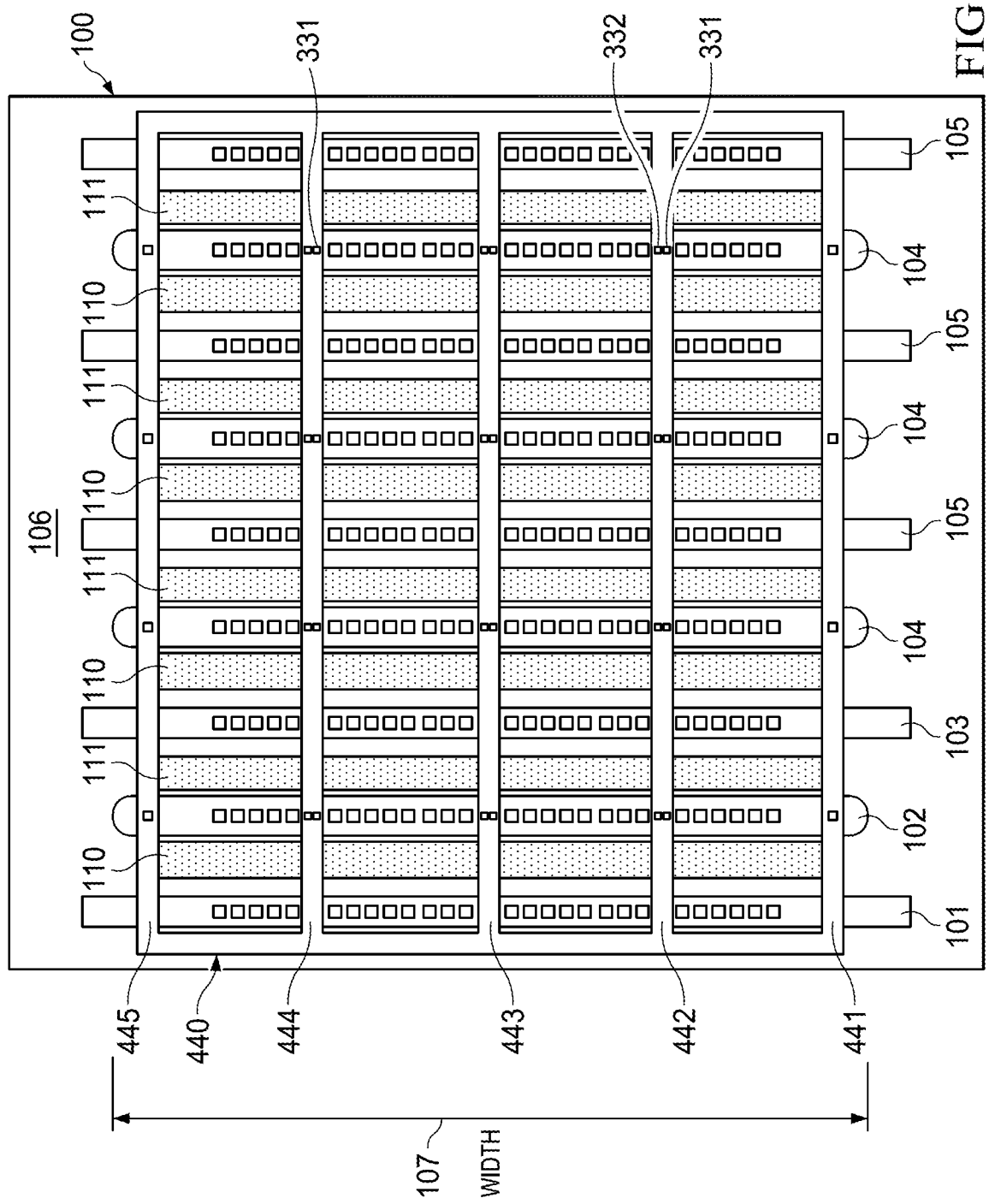
FIG. 4 illustrate example gate runner conductors for the LDMOS transistor of FIG. 1.

FIG. 4 illustrates an example metallic gate runner grid 440 with gate runner conductors 441-445 for the LDMOS transistor 100 of FIG. 1. At each intersection of a gate runner and a source region, contacts may be made to the underlying polysilicon gate structure, as described with reference to FIGS. 2, 3. An oxide island 220 at each intersection insulates the contact from the underlying source region. While an example gate runner grid 440 that has five conductors is illustrated here, in other embodiments more or fewer gate runner conductors may be implemented in order to provide sufficiently low gate resistance to assure uniform gate turn-on/off.

While the gate runner conductors 441-445 are illustrated as being perpendicular to the source region stripes 102, 104, in another embodiment the gate runner conductors may be oriented parallel to the source region stripes.

Drain and source interconnects may be provided on a same metal layer as gate runner grid 440 or on additional metal layers, for example.

In this manner, a layout is provided where the gate is contacted within the source window at regular intervals without breaking up or terminating the transistor finger. The layout may reduce area overhead by 7-8%, for example, as compared to a device in which the gate is segmented to provide contacts. This solution helps reduce gate resistance with no significant penalty on device Rdson FIG. 5 is a cross-sectional view of LDMOS transistor 100 at cut line A-A in FIG. 3. FIG. 5 shows only a small portion of LDMOS transistor 100 between source region stripe 102 and drain stripe 101; however, this is representative of the rest of LDMOS transistor 100. For example, the region between source region stripe 102 and drain region stripe 103 is a mirror image of FIG. 5.

Referring back to FIG. 3, drain region stripe 101 includes an n+ region 221 that is diffused into an nwell 550. Nwell 550 is diffused into a p type epitaxial ("epi") layer 547 of semiconductor substrate 106, as shown in FIG. 5. Epi layer 547 is formed on top of bulk region 546 of semiconductor substrate 106 using known processing techniques. N+ region 221 connects to a string of contacts 223 that provide a connection to a drain conductive interconnect, not shown. Nwell 550 forms a lateral extended region, typically referred to as a "drift region," with a low doping level to allow operation of LDMOS transistor 100 at higher voltage levels.

Source region stripe 102 includes an n+ region 225 that is diffused into a pwell 551. Pwell 551 is diffused into epi layer 547, as shown in FIG. 5. P+ region 552 is also diffused into pwell 551 and forms a contact region for contacts 227. Pwell 551 may also be referred to as a "double diffused well" (dwell) because the P-type body layer may be formed via implantation through the same opening in the same mask utilized to establish an N-type surface layer (not shown here) of the double diffused pwell 551.

A channel region stripe 230 is located substantially parallel to and between the source region stripe 102 and the drain region stripe 101 in pwell 551. Similarly, a channel region stripe 231 is located substantially parallel to and between the source region stripe 102 and the drain region stripe 103.

A gate oxide 541 overlies channel region stripe 230. A field oxide 540 lies between gate oxide 541 and n+ region 221. Polysilicon gate structure 110 overlies gate oxide 541 and field oxide 540 over channel region stripe 230. Similarly, polysilicon gate structure 111 overlies gate oxide 541 and field oxide (not shown) over channel region stripe 231. Polysilicon extension 112 extends from gate structure 110 and gate structure 111 to overlie the oxide island 220 that is formed over n+ regions 225, 226. Note, p+ region 552 does not underlie the oxide island 220, but may be located on each side of oxide island 220 due to blocking of the implant by the oxide island 220. Contacts 331, 332 (not shown in FIG. 5) may then be formed to contact a gate runner conductor 441 that is formed above the gate structures over insulating layer 548.

Figure 6:
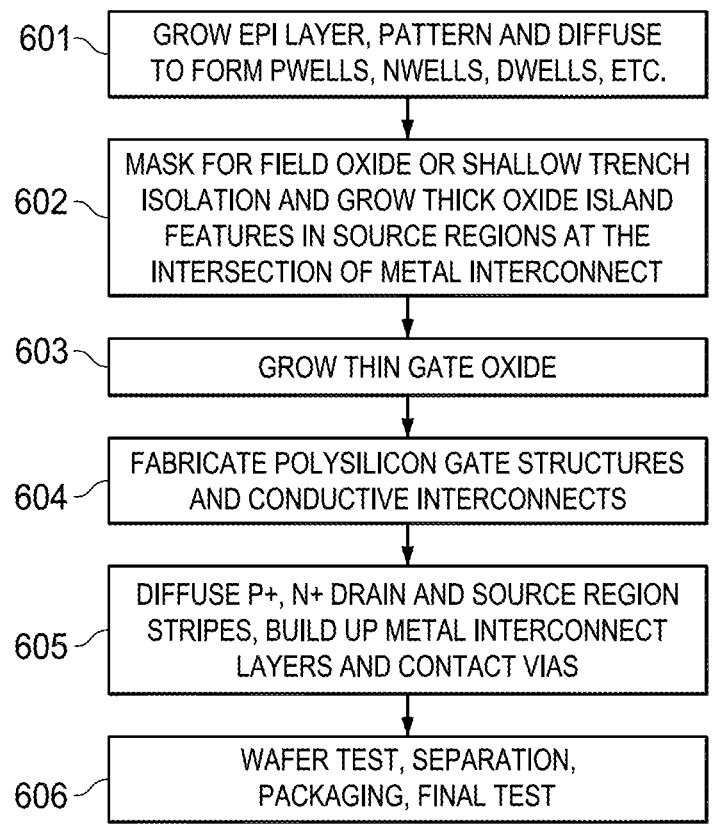
FIG. 6 is a flow chart illustrating a method for forming an LDMOS transistor.

FIG. 6 is a flow chart illustrating a method for forming polysilicon gate contacts in an LDMOS transistor, such as LDMOS transistor 100 of FIGS. 1-5. As mentioned above, the general operation of LDMOS transistors is well known. Similarly, the semiconductor process for fabricating an LDMOS transistor is well known. Therefore, only the key fabrication steps based on this disclosure will be described in detail herein.

Initially, a semiconductor wafer is processed to form an epitaxial layer on top of the semiconductor wafer in step 601. Nwell, pwell, and dwell regions are then patterned and diffused into the epi layer, as illustrated in FIG. 5, using known or later developed fabrication techniques.

A mask is then applied in step 602 to form thick field oxide regions. As disclosed above, thick field oxide regions, such as oxide islands 220 in FIG. 2, may be formed in the source regions to coincide with each intersection of metallic interconnect lines and the source region fingers. Other field oxide regions may be defined, such as field oxide 540 over nwell 550. An oxidation step is then performed to grow the thick field oxide in the drift regions and source regions as illustrated in FIGS. 2-5.

In another embodiment, thick oxide islands such as oxide islands 220 in FIG. 2 may be formed using a shallow trench isolation (STI) process. In this case, a portion of silicon is etched in step 602 and then filled with oxide. Thick oxide formed using STI may be planarized with the top of the thick filled oxide being at approximately the same level as the adjacent silicon top surface.

A thin gate oxide layer may then be grown over the wafer in step 603.

Additional fabrication steps may then be performed in step 604 to deposit a polysilicon layer and etch it to form the polysilicon gate structures with extensions that overlie the source region and thick field oxide islands, as described above with regard to FIGS. 2-5.

Additional diffusions may be performed in step 605 to form the p+ and n+ drain and source region stripes described in more detail above with regards to FIGS. 2, 5, followed by one or more insulating layers and conductive layers that are patterned and etched to form interconnects, etc. Vias and contacts may be formed between the metal interconnects and the polysilicon gate structures in the fingers that overlie the thick field oxide islands in the source regions.

After the semiconductor processing is completed, wafer testing is performed in step 606, followed by a sawing operation to separate the die, packaging, and final testing of the integrated circuit.

System Example

Figure 7:
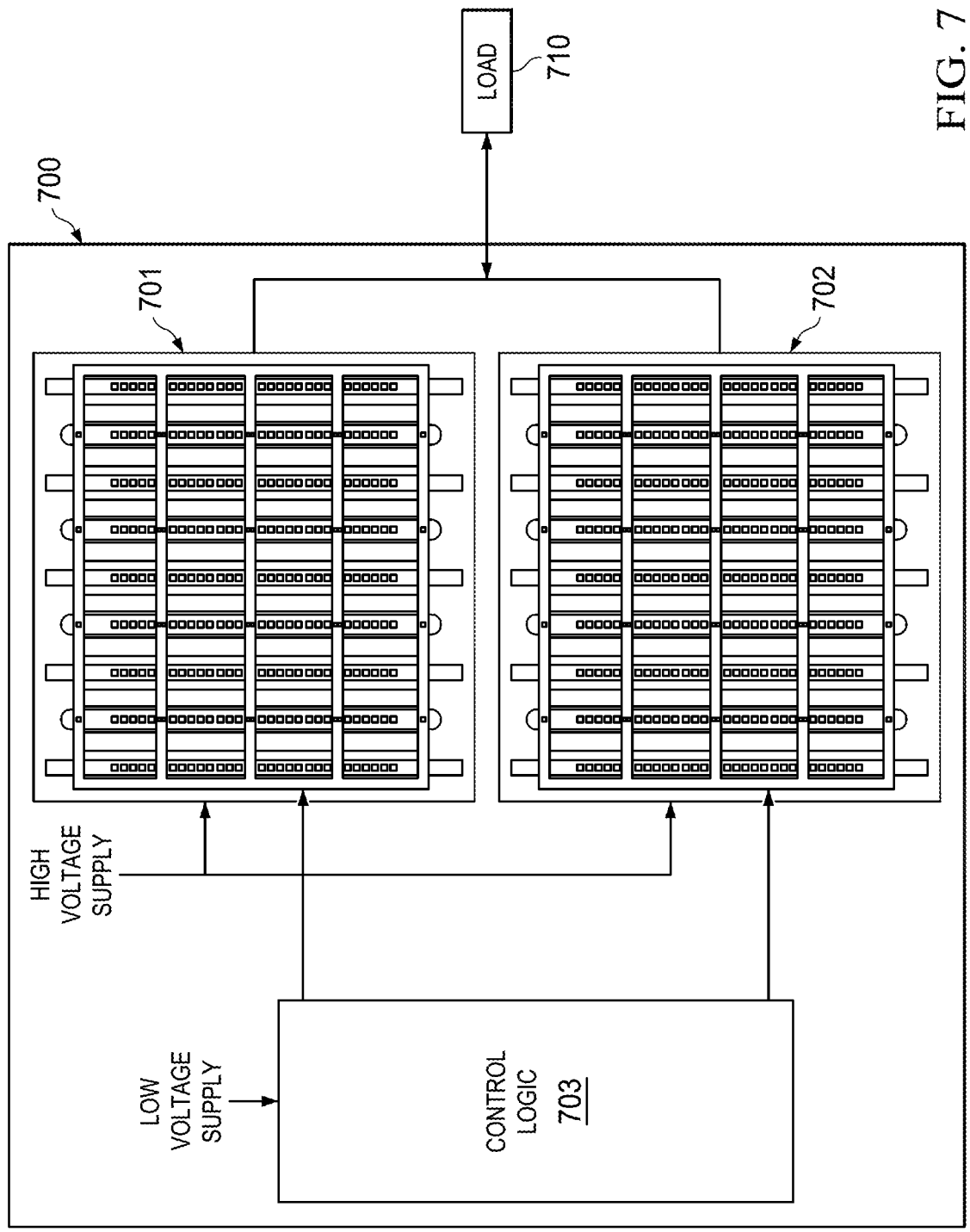
FIG. 7 is a block diagram of an example system with integrated circuit (IC) that includes an LDMOS transistor.

FIG. 7 is a block diagram of an example system with integrated circuit (IC) 700 that includes an LDMOS transistor. In this example, two LDMOS transistors 701, 702 are included, each of which may be similar to the LDMOS transistor described with regard to FIGS. 1-5.

Control logic 703 may also be included within IC 700. Control logic may be tailored to perform a particular control task, or may be implemented as a processor core that may include memory for holding software and firmware instructions that may be executed by the processor to control the operation of LDMOS transistors 701, 702, for example. Additional interface logic, etc., may be included within IC 700.

Various types of systems may be implemented by connecting a load such as load device 710 to be powered under control of IC 700. Systems such as microwave and radio frequency (RF) power amplifiers may be implemented for example. Various types of industrial, residential, commercial, medical, etc. systems may be implemented using power transistors that are fabricated using the techniques disclosed herein to control motors, actuators, lights, etc.

Other Embodiments

While the disclosure has been described with reference to illustrative embodiments, this description is not intended to be construed in a limiting sense. Various other embodiments of the disclosure will be apparent to persons skilled in the art upon reference to this description. For example, while a LDMOS device was described herein, other embodiments may include other commonly known or later developed power transistors, such as: horizontal or vertical type double diffused power transistors (DMOS), double diffused drain MOS (DDDMOS) transistors, insulated gate bipolar transistors (IGBT), drain extended MOS (DEMOS) transistors, drain extended complimentary MOS (DE-CMOS) transistors, etc. In each case, thick oxide islands may be provided in a source region to allow contacts between metallic interconnect structures and polysilicon gate structures without reducing an effective channel width of the power transistor.

While thick oxide islands, such as oxide islands 220 in FIG. 5, are illustrated herein as being thick field oxide, in another embodiment the thick oxide islands may be fabricated using a shallow trench isolation process, for example.

While polysilicon gate structures are described herein, other embodiments may make use of a combination of a polysilicon and a polysilicide layer. The polysilicide layer may be made using tungsten, titanium, nickel, cobalt, etc.

While a multi-finger power transistor was described herein, other embodiments may include a single finger power transistor. In some embodiments, there may only be a single drain region stripe and a single source region stripe.

While a linear transistor finger was described herein, in some embodiments, the finger topology may be other shapes than linear. For example, each finger may be configured as a circle, a square, a rectangle, u-shaped, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. An integrated circuit comprising:
a semiconductor substrate;
a transistor finger extending into the semiconductor substrate, the transistor finger including:
a source region stripe;
a drain region stripe substantially parallel to the source region stripe;
a channel region stripe located substantially parallel to and between the source region stripe and the drain region stripe;
a plurality of thick oxide islands overlying and spaced apart along the source region stripe; and
a gate structure that overlies the channel region stripe and the thick oxide islands.

2. The integrated circuit of claim 1, wherein a metal gate runner is conductively connected to the gate structure.

3. The integrated circuit of claim 2, wherein the transistor finger is one of a plurality of transistor fingers each having a corresponding gate structure overlying a corresponding plurality of thick oxide islands, and the metal gate runner is conductively connected to the corresponding gate structures.

4. The integrated circuit of claim 1, wherein the channel region stripe is a first channel region stripe and the source region stripe is between the first channel region stripe and a second channel region stripe, and the gate structure overlies the second channel region stripe.

5. The integrated circuit of claim 2, wherein the transistor finger is a first transistor finger having a long axis extending in a first direction, the gate structure is a first gate structure, and the plurality of thick oxide islands are a first plurality of thick oxide islands, and further comprising:
- a second transistor finger having a second source region stripe;
- a second gate structure overlying the second source region stripe;
- a second plurality of thick oxide islands overlying and spaced apart along the second source region stripe; and
- a plurality of metal gate runner conductors having a long axis in a direction different than the first direction, each metal gate runner conductor connected to the first gate structure over one of the first plurality of thick oxide islands and to the second gate structure over one of the second plurality of thick oxide islands.

6. The integrated circuit of claim 1, wherein the transistor finger is a portion of a power transistor of a power amplifier.

7. An integrated circuit comprising:
- a substrate including an epitaxial layer having a first conductivity type;
- a source stripe having an opposite second conductivity type within the epitaxial layer and having a long axis extending along a first direction;
- a drain stripe having the second conductivity type within the epitaxial layer and having a long axis extending parallel to the source stripe;
- a gate stripe over the substrate and between the source stripe and the drain stripe; and
- a gate runner grid having a plurality of gate runner conductors having long axes extending along a different second direction,
- wherein each of the gate runner conductors is conductively connected to the gate stripe via a corresponding one of a plurality of gate extensions that extend from the gate stripe over the source stripe.

8. The integrated circuit of claim 7, wherein the source stripe is a first source stripe, the drain stripe is a first drain stripe, the gate stripe is a first gate stripe; and further comprising:
- a second source stripe having the second conductivity type within the epitaxial layer and having a long axis extending along the first direction;
- a second drain stripe having the second conductivity type within the epitaxial layer and having a long axis extending along the first direction; and
- a second gate stripe over the substrate and between the second source stripe and the second drain stripe,
- wherein each of the gate runner conductors is conductively connected to the second gate stripe via a corresponding gate extension that extends from the second gate stripe over the second source stripe.

9. The integrated circuit of claim 7, wherein the gate extensions are located over corresponding thick oxide islands over the source stripe.

10. The integrated circuit of claim 7, wherein the first conductivity type is p-type and the second conductivity type is n-type.

11. The integrated circuit of claim 7, wherein the source stripe, the drain stripe, and the gate stripe are portions of a power transistor, and further comprising control circuitry configured to cooperate with the power transistor to drive a load.

12. The integrated circuit of claim 7, wherein the source stripe, the drain stripe, and the gate stripe are portions of a power transistor located in a device package.

13. The integrated circuit of claim 7, wherein the epitaxial layer comprises silicon.

14. A transistor comprising:
- a substrate surface layer having a first conductivity type over a semiconductor substrate;
- a plurality of source stripes having an opposite second conductivity type extending into the substrate surface layer and along a vertical direction over the semiconductor substrate;
- a plurality of drain stripes having the second conductivity type extending into the substrate surface layer and along the vertical direction over the semiconductor substrate, the source stripes alternating with the drain stripes;
- a plurality of gate stripes arranged in gate stripe pairs extending over the semiconductor substrate, each source stripe located between first and second gate stripes of a corresponding gate stripe pair; and
- a plurality of gate extensions over the source stripe, each gate extension contiguously connecting the first gate stripe of a corresponding gate stripe pair to the second gate stripe of the corresponding gate stripe pair.

15. The transistor of claim 14, wherein a thick oxide island is located between each of the gate extensions and the source stripes.

16. The transistor of claim 15, wherein gate extensions are conductively connected to a gate runner grid by a corresponding contact located over each of the thick oxide islands.

17. The transistor of claim 14, wherein the substrate surface layer includes a p-type epitaxial layer.

18. The transistor of claim 14, wherein the substrate surface layer includes silicon.

19. The transistor of claim 14, wherein the transistor is electrically connected to control circuitry over the substrate surface layer.

20. The transistor of claim 14, wherein the transistor is a first transistor, and is configured to cooperate which a second transistor over the substrate surface layer to control a load.

* * * * *